United States Patent
Ishiyama et al.

(10) Patent No.: US 9,073,018 B2
(45) Date of Patent: Jul. 7, 2015

(54) MICRO MIXER

(75) Inventors: Fumihiko Ishiyama, Chiba (JP); Takeshi Hizawa, Chiba (JP); Kiyoo Kamei, Chiba (JP)

(73) Assignee: DIC CORPORATION, Tokyo (JP)

( * ) Notice: Subject to any disclaimer, the term of this patent is extended or adjusted under 35 U.S.C. 154(b) by 140 days.

(21) Appl. No.: 13/807,009

(22) PCT Filed: Jun. 23, 2011

(86) PCT No.: PCT/JP2011/064388
§ 371 (c)(1),
(2), (4) Date: Dec. 27, 2012

(87) PCT Pub. No.: WO2012/002249
PCT Pub. Date: Jan. 5, 2012

(65) Prior Publication Data
US 2013/0114369 A1 May 9, 2013

(30) Foreign Application Priority Data

Jun. 28, 2010 (JP) ................. 2010-146232

(51) Int. Cl.
*B01F 5/06* (2006.01)
*B01F 5/02* (2006.01)
*B01F 13/00* (2006.01)
*B01F 15/06* (2006.01)
*B81B 1/00* (2006.01)

(52) U.S. Cl.
CPC ........... *B01F 5/0256* (2013.01); *B01F 13/0059* (2013.01); *B01F 15/065* (2013.01); *B81B 1/00* (2013.01)

(58) Field of Classification Search
CPC ..................................... B01F 5/0256
USPC ............ 366/181.5–181.6, 336–337, 340–341
See application file for complete search history.

(56) References Cited

U.S. PATENT DOCUMENTS

| | | | | |
|---|---|---|---|---|
| 5,289,224 A | * | 2/1994 | Devaney et al. | 396/626 |
| 5,296,375 A | * | 3/1994 | Kricka et al. | 435/2 |
| 5,427,946 A | * | 6/1995 | Kricka et al. | 435/288.5 |
| 5,486,335 A | * | 1/1996 | Wilding et al. | 422/400 |
| 5,637,469 A | * | 6/1997 | Wilding et al. | 435/7.21 |

(Continued)

FOREIGN PATENT DOCUMENTS

| | | |
|---|---|---|
| JP | H9-512742 | 12/1997 |
| JP | 2003-199544 | 7/2003 |
| JP | 2007-225438 | 9/2007 |
| JP | 2008-246283 | 10/2008 |
| JP | 2009-119387 | 6/2009 |

*Primary Examiner* — David Sorkin
*Assistant Examiner* — Abbas Rashid
(74) *Attorney, Agent, or Firm* — Jianq Chyun IP Office (57) ABSTRACT

Disclosed is a micro mixer which includes a mixing plate (14) with a first channel-forming section and a second channel-forming section. The first channel-forming section has a first channel formed for a first fluid to flow therethrough, while the second channel-forming section has a second channel formed for a second fluid to flow therethrough. Between the first channel-forming section and the second channel-forming section, there is provided a combined channel in which the first fluid and the second fluid merge with each other. The outlet of the first channel and the outlet of the second channel are opposed to each other with the combined channel disposed therebetween. The position of the outlet of the first channel facing the center axis of the combined channel is included in or the same as the position of the outlet of the second channel facing the center axis.

8 Claims, 8 Drawing Sheets

(56) References Cited

U.S. PATENT DOCUMENTS

| | | | |
|---|---|---|---|
| 5,783,129 A | * | 7/1998 | Shirai et al. .................... 264/136 |
| 5,866,345 A | * | 2/1999 | Wilding et al. ............... 435/7.21 |
| 6,156,273 A | * | 12/2000 | Regnier et al. .................. 422/70 |
| 6,221,654 B1 | * | 4/2001 | Quake et al. ................ 435/287.3 |
| 6,296,020 B1 | * | 10/2001 | McNeely et al. .............. 137/806 |
| 2003/0039169 A1 | * | 2/2003 | Ehrfeld et al. ................. 366/336 |
| 2008/0108122 A1 | * | 5/2008 | Paul et al. ...................... 435/183 |

\* cited by examiner

FIG. 16

MICRO MIXER

CROSS-REFERENCE TO RELATED APPLICATION

This application is a 371 of international application of PCT application serial no. PCT/JP2011/064388, filed on Jun. 23, 2011, which claims the priority benefit of Japan application no. 2010-146232, filed on Jun. 28, 2010. The entirety of each of the above-mentioned patent applications is hereby incorporated by reference herein and made a part of this specification.

BACKGROUND OF THE INVENTION

1. Field of the Invention

The present invention generally relates to a micro mixer.

2. Description of Related Art

Various static mixers for mixing at least two or more types of fluids have been proposed. Static mixers are used in fine particle manufacturing by chemical reaction and crystallization. Among them, micro mixers in which the fluids to be mixed are supplied in the micro channels have been attracting attention.

Micro mixers have micro channels in which the micro channel width is in a range of 10 μm to 1000 μm. In the micro mixer, at least two types of fluids are mixed after being divided into minute flows by micro channel. In the micro mixer, the fluids are divided into minute flows and the fluid diffusion distance becomes shorter. Accordingly, the fluid mixing speed becomes faster. Thus, compared to the conventional static mixers, micro mixers can efficiently mix fluids in a small period of time.

As for the structure of micro mixers, for example, mixers having Y-shaped channels are well known. In such kind of mixers, the channel for the first fluid and the channel for the second fluid intersect to in an acute angle, i.e., Y-shaped, so as to form a merging channel. The fluids respectively supplied in the channels merge at the intersection point of channels in a state of laminar flow. After that, each fluid diffuses and mixes with each other.

In Patent Reference 1, a lamination micro mixer is disclosed. The disclosed lamination micro mixer includes a plate in which a micro channel for a to-be-mixed reactant A to flow therethrough is formed and a plate in which a micro channel for a to-be-mixed reactant B to flow therethrough is formed. Viewing from the above of the plates, the micro channels intersect to form an acute angle. Each of the fluids merges at the inlet of the mixing/reacting chamber.

As described above, in the mixers in which channels are arranged in a Y shape and the mixers in which micro channels are arranged in an acute angle, each of the fluids mixes in a laminar state. Therefore, each aforementioned mixer is suitable for mixing low viscosity fluids. However, in case of mixing high viscosity fluids or mixing fluids having large difference in viscosity, there is a problem that the contact area of fluids and shear force in the fluids may be reduced, and mixing efficiency may be decreased.

RELATED ART

Patent Reference

Patent Reference 1: Japan Laid open publication No. He 9-512742

SUMMARY OF THE INVENTION

Problems that the Invention is to Solve

The object of the present invention is to provide a micro mixer and a fluid mixing structure capable of efficiently mixing high viscosity fluids or fluids having different viscosity.

Means for Solving the Problems

In order to achieve the above mentioned object, according to a first embodiment of the present invention, a micro mixer for mixing two or more types of fluids is provided. The micro mixer includes a mixing plate having a first channel-forming section and a second channel-forming section. The first channel-forming section has a first channel formed for a first fluid to flow therethrough. The second channel-forming section has a second channel formed for a second fluid to flow therethrough. Between the first channel-forming section and the second channel-forming section, a combined channel in which the first fluid and the second fluid merge with each other is disposed. The outlet of the first channel and the outlet of the second channel are opposite to each other with the combined channel disposed therebetween. The position of the outlet of the first channel facing the center axis of the combined channel is included in or the same as the position of the outlet of the second channel facing the center axis. In addition, in the micro mixer, the mixing plate consists of a pair of plates, and the width of the combined channel is configured by adjusting the distance between the pair of plates.

In such configuration, the flow direction of the first fluid transmitted from the first channel and the flow direction of the second fluid transmitted from the second channel are in opposite directions and symmetric with respect to the axis of the combined channel. Thus, the fluids collide at the combined channel from the front. As such, the contact area of the fluids is increased and shear force is induced around the colliding position. Accordingly, efficiently mixing high viscosity fluids or fluids having different viscosity is achievable.

In the above mentioned micro mixer, the center axis of the cross-section of the outlet of the first channel is preferred to be the same as the center axis of the cross-section of the outlet of the second channel.

In such configuration, since the fluids, which are respectively transmitted from the outlets of the first channel and the second channel, collide from the front, efficiently mixing high viscosity fluids or fluids having different viscosity is achievable.

In the above mentioned micro mixer, it is preferable that the outlet surface of the first channel is parallel to the outlet surface of the second channel.

In such configuration, the flow direction of the first fluid from the first channel and the flow direction of the second fluid from the second channel are parallel and in opposite directions. Accordingly, the contact area of the fluids is increased and efficiently mixing high viscosity fluids or fluids having different viscosity is achievable.

In the above mentioned micro mixer, it is preferable that the outlet of the first channel is one of the plurality of outlets, the outlet of the second channel is one of the plurality of outlets and the outlet of the first channel and the outlet of the second channel are in one-to-one relationship and opposite to each other.

In such configuration, it is capable that each of the fluids is respectively divided into a plurality of micro flows, such that the divided micro flows collide in a one-to-one relationship. Accordingly, the contact area of the fluids is increased and mixing speed is increased.

In the above mentioned micro mixer, it is preferable that the combined channel is formed in an elongated shape, at one side surface of a pair of opposite side surfaces which form the combined channel, a plurality of outlets of the first channel are arranged side by side along the longitudinal direction of the combined channel, and at the other side surface, a plurality of outlets of the second channel are arranged side by side along the longitudinal direction of the combined channel.

In such configuration, without changing the distance between the outlets of the channel, by adjusting the length of the combined channel or increasing the quantity of channels, the processing amount of the micro mixer is increased. Accordingly, the processing amount can be increased without reducing the collision effect of the fluids.

In the above mentioned micro mixer, it is preferable that a temperature control plate laminated to the mixing plate is included. The temperature control plate has a first medium channel for a first medium to flow therethrough, a second medium channel for a second medium to flow therethrough, and a heat insulating section disposed between the first medium channel and the second medium channel. In the case that the mixing plate and the temperature control plate are laminated, the first channel-forming section and the first medium channel are disposed to correspond to the lamination direction, and the second channel-forming section and the second medium channel are disposed to correspond to the lamination direction.

In such configuration, the first medium only acts upon the first fluid, the second medium only acts upon the second fluid. In addition, since heat conduction between the first medium and the second medium can be suppressed by the heat insulating section disposed between the first and second medium channels, it is possible to adjust the temperature accurately.

In the micro mixer, the heat insulating section consists of a space of a predetermined width and has a depth of a same distance as the thickness of the temperature control plate. It is preferred that, through the configuration of the heat insulating section of the temperature control plate being overlapped to the combined section of the mixing plate, a combined section which has a depth of a same distance as the length of the lamination direction is configured to the laminated body consisting of the temperature control and the mixing plate. In the above mentioned micro mixer, it is preferable that at the first channel and the second channel, the cross-section area of the outlet is smaller than the cross-section area of the inlet.

In such configuration, the flow rate of the fluid transmitted from the combined channel can be increased, thus mixing effect of the fluids can be further improved.

DESCRIPTION OF THE EMBODIMENTS

In the following, the micro mixer of the present invention is described as one embodiment in accordance with FIG. 1 to FIG. 6.

Figure 1:
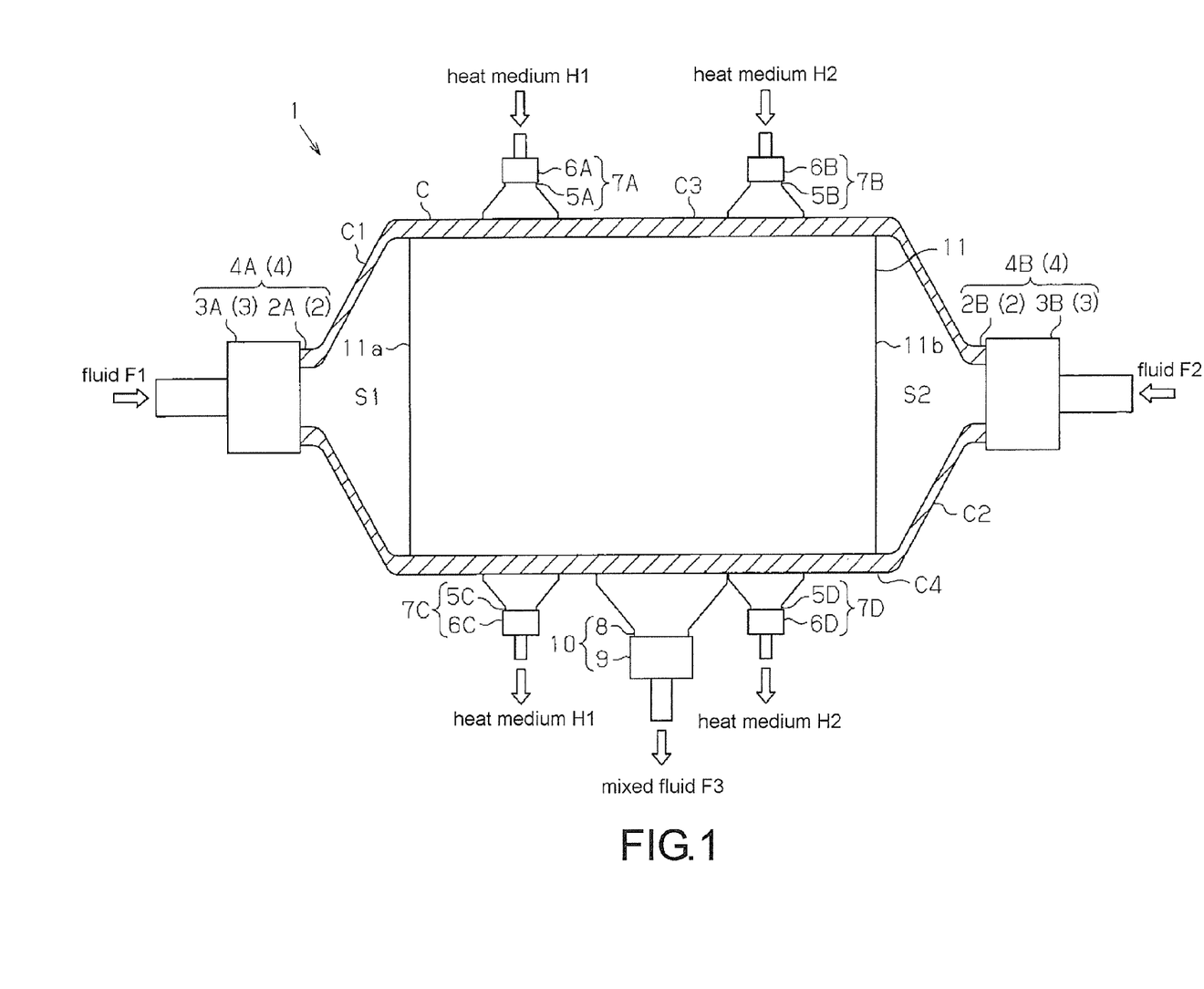
FIG. 1 is a schematic view of a micro mixer of an exemplary embodiment of the present invention.

As shown in FIG. 1, the micro mixer 1 has a hollow-shaped case C. In the case C, a laminated body 11 in which various micro channels are formed is fixed. The laminated body 11 has channels for a first fluid F1 and a second fluid F2 which are mixing objects or reacting objects and a first heat medium H1 (a first medium) and a second heat medium H2 (a second medium) to flow therethrough. The first heat medium H1 and the second heat medium H2 respectively perform heat exchange with the fluids F1, F2.

At the left end C1 of the case C, a first fluid supply section 4A to supply the first fluid F1 into the case C is disposed. At the right end C2 of the case C, a second fluid supply section 4B to supply the second fluid F2 into the case C is disposed. In the following, each fluid supply section 4A, 4B is not distinctly described, and merely it is described as the fluid supply section 4.

The fluid supply section 4 has an opening 2 formed at the end of the case C and a connector 3 connected to the opening 2. The connector 3 is connected to the tank for respectively storing the fluids F1, F2. In addition, the connector 3 is connected to a pressurizing pump and a pumping mechanism in which pipes connected to the pump are included. Each of the fluids F1, F2 is respectively pumped toward the connector 3 in a pressurized condition by the pumping mechanism. The openings 2 are respectively disposed at two ends of the case C. Spaces are disposed between the openings 2 and each side surface 11a, 11b of the laminated body 11 of the case C. The spaces serve as storage sections S1, S2 to temporarily store the fluids F1, F2 which are transmitted from the pumping mechanism.

At the upper end C3 of the case C, heat medium supply sections 7A, 7B are formed. The first heat medium H1 is supplied into the case C through the heat medium supply section 7A, and the second heat medium H2 is supplied into the case C through the heat medium supply section 7B. Similar to the fluid supply section 4, the heat medium supply sections 7A, 7B respectively have openings 5A, 5B and connectors 6A, 6B. At the bottom end C4 of the case C, heat medium sending sections 7C, 7D are formed. Heat mediums H1, H2 supplied by each of the heat medium supply sections 7A, 7B pass from the channels located in the laminated body 11 and are respectively sent out to the external of the case C by each of the heat medium sending sections 7C, 7D. Similar to the fluid supply section 4, the heat medium sending sections 7C, 7D respectively have openings 5C, 5D and connectors 6C, 6D.

At the bottom end C4 of the case C, a sending section 10 is disposed. A mixed fluid F3 (or reacted fluid) of the fluids F1, F2 which are mixed or reacted in the laminated body 11 is sent out to the external of the case C through the sending section 10. The sending section 10 has an opening 8 and a connector 9 connected to the opening 8.

In other words, the fluids F1, F2 are supplied into the case C from each of the fluid supply sections 4A, 4B and mixed or reacted in the micro channels of the laminated body 11. Herein, since the fluids F1, F2 are mixed in the micro channel, the diffusion distance of each fluid F1, F2 is decreased. As such, mixing speed of each fluid F1, F2 is increased and the desired amount of each fluid F1, F2 is efficiently mixed. Each of the fluids F1, F2 is mixed and formed the mixed fluid F3 (or reacted fluid), and is sent out to the external of the case C from the sending section 10. However, the positions of the case C, each fluid supply section 4A, 4B and the sending section 10 of the micro mixer 1 are not limited to the above mentioned configuration and can be changed as required.

Next, the laminated body 11 is described with reference to FIG. 2.

Figure 2:
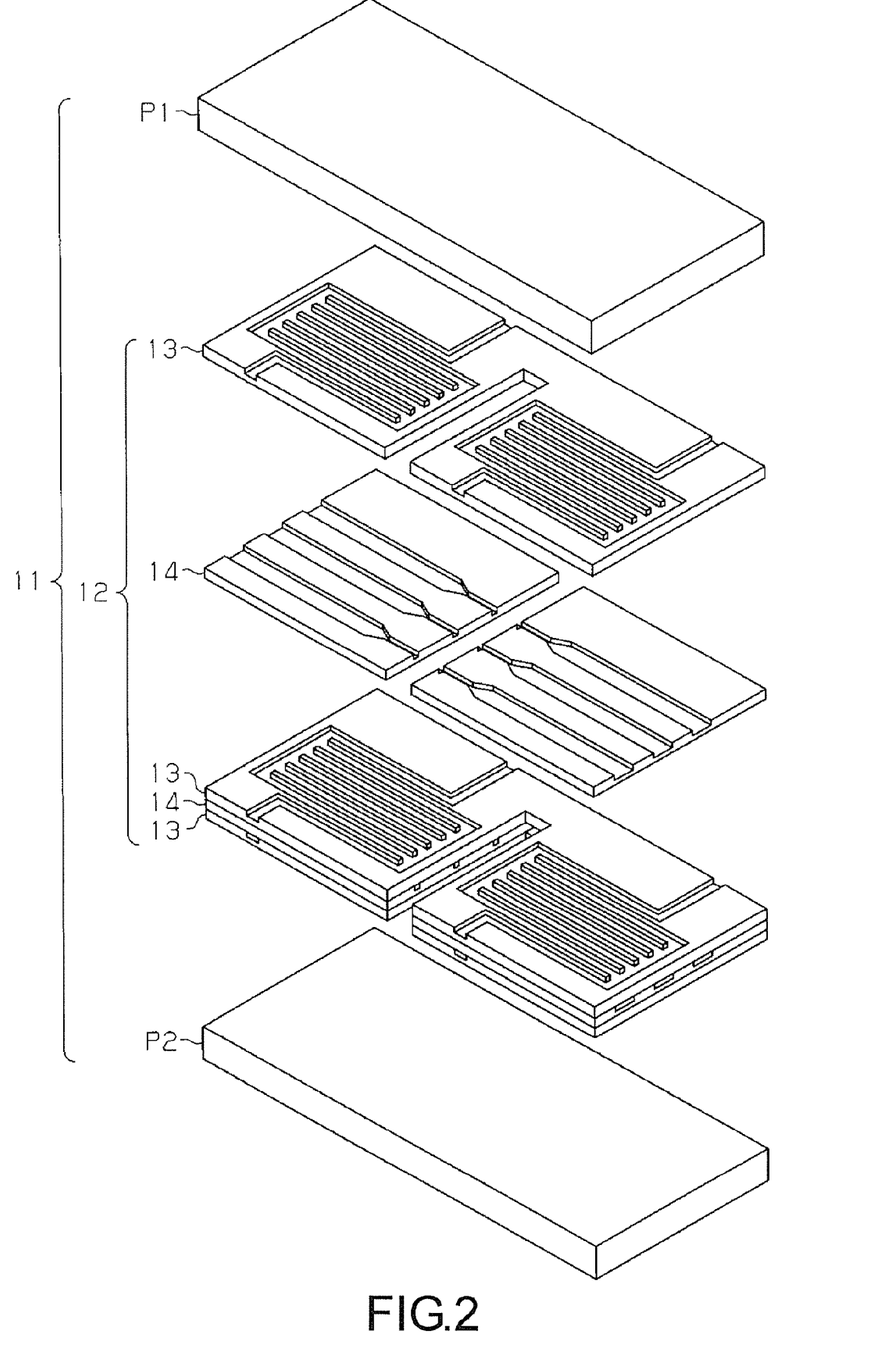
FIG. 2 is an exploded perspective view of the laminated body.

As shown in FIG. 2, the laminated body 11 includes a pair of rectangular cover plates P1, P2 and a plate group 12 consisting of a plurality of plates. The plate group 12 is disposed between the two cover plates P1, P2. The plate group 12 includes three temperature control plates 13 and two mixing plates 14. The temperature control plates 13 are configured as the upper most layer and the lower most layer of the plate group 12, and each mixing plate 14 is laminated in a manner of being sandwiched between the temperature control plates 13.

All of the external shapes of each cover plate P1, P2, each temperature control plate 13 and each mixing plate 14 have the same rectangular shape. Each cover plate P1, P2, each temperature control plate 13 and each mixing plate 14 are formed by, for example, metal material, resin, glass, ceramic, or the like. In the case that each plate 13, 14, P1, P2 are formed by using those materials, the processing of forming channels becomes easier and each plate can be fixed to each other in an adhered state such that fluid leakage is prevented. Each plate 13, 14, P1, P2 can be formed by the same material or different materials. For example, each plate 13, 14, P1, P2 can be formed by stainless steel and each plate can also be fixed to each other in an adhered state by diffusion bonding. The processing method of each plate 13, 14, P1, P2 includes, for example, injection molding, solvent casting method, melt replication process, cutting, etching, photolithography, laser ablation, or the like.

Next, the mixing plate 14 is described with reference to FIG. 3 and FIG. 4.

Figure 3:
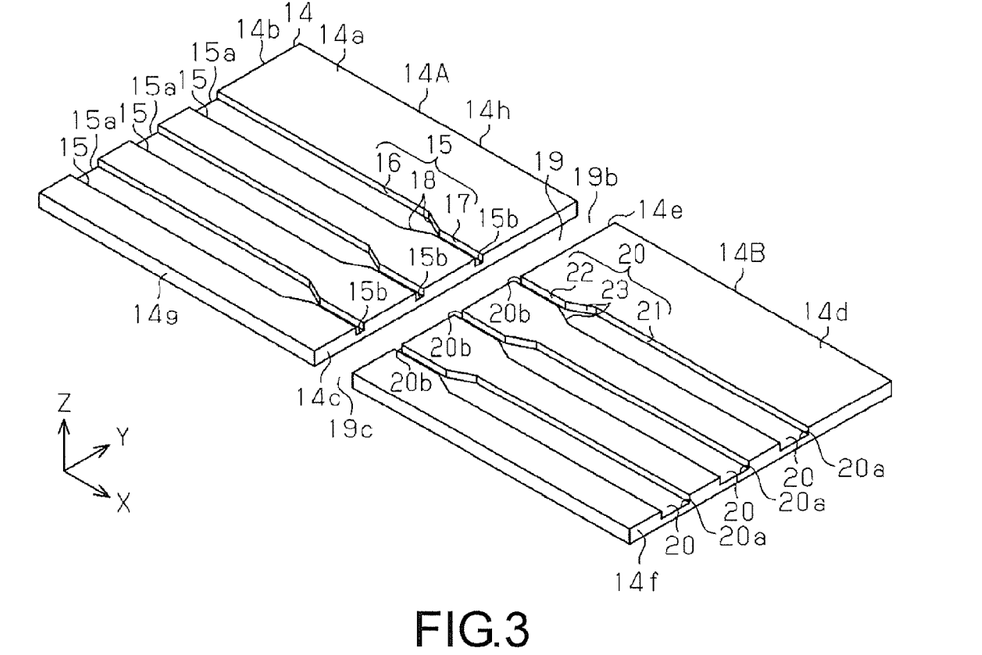
FIG. 3 is a perspective view of the mixing plate.

As shown in FIG. 3, the mixing plate 14 consists of a pair of plates. The mixing plate 14 has the first channel-forming section 14A and the second channel-forming section 14B. Both of the first and second channel-forming sections 14A, 14B are rectangular and formed in a plate shape. At the center of the width direction (the Y direction in the figure) of the upper surface 14a of the first channel-forming section 14A, three first channels 15 are formed. The first channels 15 are arranged in equal intervals. Each of the first channels 15 is formed in a shape of groove extending from the left end 14b of the first channel-forming section 14A to the right end 14c.

Each of the first channels 15 is opened at the left end 14b, the right end 14c and the upper surface 14a of the first channel-forming section 14A. The opening of the left end 14b of the first channel-forming section 14A forms the inlet 15a of the first channel 15, and the right end 14c of the first channel-forming section 14A forms the outlet 15b of the first channel 15. The inlet 15a communicates with the first fluid supply section 4A in which the first fluid F1 is supplied.

The first channel 15 has a big wide-width portion 16 of flow width, a small narrow-width portion 17 of flow width and a taper portion 18. The flow width of the taper 18 is gradually reduced from the wide-width portion 16 to the narrow-width portion 17.

The cross-section of the wide-width portion 16 which is orthogonal with the flow direction of the fluid has a rectangular shape. The wide-width portion 16 extends from the left end 14b to the vicinity of the right end 14c of the first channel-forming section 14A. In order to ensure the uniformity of the temperature distribution of the fluid and the strength of the device, the width and the depth of the wide-width portion 16 are preferably set to be in a range in which the width is greater than or equal to 0.1 mm and smaller than or equal to 100 mm and the depth is smaller than or equal to 5 mm, and preferably, the width is set to be greater than or equal to 0.1 mm and smaller than or equal to 20 mm and the depth is set to be smaller than or equal to 2 mm. In other words, the wide-width portion 16 can be designed that pressure loss does not increase, channel blocking is hard to occur, rapidly heating/cooling the channel is capable and productivity is improved.

The cross-section of the narrow-width portion 17 is also formed in a rectangular shape. The narrow-width portion 17 extends from the vicinity of the right end 14c of the first channel-forming section 14A to the right end 14c. The narrow-width portion 17 has a cross-section area at least smaller than the cross-section area of the wide-width portion 16. For example, the width and the depth of the narrow-width portion 17 are preferably set to be in a range in which the width is greater than or equal to 0.1 mm and smaller than or equal to 20 mm and the depth is smaller than or equal to 5 mm, and preferably, the width is set to be greater than or equal to 0.1 mm and smaller than or equal to 5 mm and the depth is set to be smaller than or equal to 2 mm. In other words, the narrow-width portion 17 can be designed that pressure loss does not increase, channel blocking is hard to occur, rapidly heating/cooling the channel is achievable and productivity is improved.

The combined channel 19 is disposed between the first channel-forming section 14A and the second channel-forming section 14B. The combined channel 19 consists of a space having a predetermined width. The combined channel 19 is opened at the bottom and the top, and opened at the front surface 14g and the back surface 14h of the mixing plate 14. The opening section 19c opened at the front surface 14g of the mixing plate 14 is the outlet of the combined channel 19 and communicates with the sending section 10. The opening section 19b opened at the back surface 14h of the mixing plate 14 is closed by the case C or other components. The pair of side surfaces which form the combined channel 19 are respectively configured by the first and second channel-forming sections 14A, 14B. The combined channel 19 is formed as an elongated channel which is in a rectangle shape in plan view. The longitudinal direction of the combined channel 19 is parallel to the width direction of the mixing plate 14.

The second channel-forming section 14B has the second channel 20 for the second fluid F2 to flow therethrough. The second channel-forming section 14B and the first channel-forming section 14A are symmetric with respect to the combined channel 19. In other words, at the center in the short direction at the upper surface 14d of the second channel-forming section 14B, three second channels 20 are formed. The second channels 20 are arranged in equal intervals. Each of the second channels 20 is opened at the left end 14e, the right end 14f and the upper surface 14d and the bottom surface of the second channel-forming section 14B. The opening of the left end 14e of the second channel-forming section 14B is formed as the outlet 20b of the second channel 20, and the opening of the right end 14f of the second channel-forming section 14B is formed as the inlet 20a of the second channel 20. The inlet 20a communicates with the second fluid supply section 4B which supplies the second fluid F2.

The second channel 20 has a wide-width portion 21, a narrow-width portion 22 and a taper portion 23 disposed between the wide-width portion 21 and the narrow-width portion 22. The wide-width portion 21 has the same shape and channel width as those of the wide-width portion 16 of the first channel-forming section 14A. The wide-width portion 21 extends from the right end 14f to the vicinity of the left end 14e of the second channel-forming section 14B. The narrow-width portion 22 also has the same shape and channel width as those of the narrow-width portion 17 of the first channel-forming section 14A. The narrow-width portion 22 extends from the vicinity of the left end 14e to the left end 14e of the second channel-forming section 14B.

Figure 4:
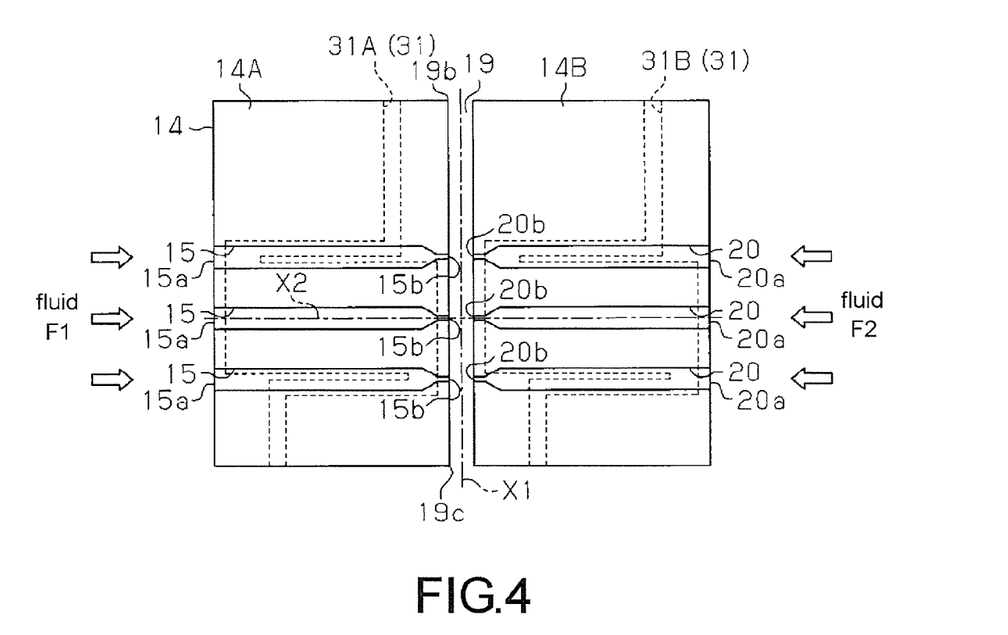
FIG. 4 is a plan view of the mixing plate.

As shown in FIG. 4, the first and second channel-forming sections 14A, 14B are disposed in a manner that the outlets 15b of the first channels 15 are opposite to the outlets 20b of the second channels 20 with respect to the combined channel 19. The position of the outlet 15b facing the center axis X1 of the combined channel is the same as the position of the outlet 20b facing the center axis X1. The outlet planes of the outlet 15b and the outlet 20b are parallel. In addition, the center axis of the cross-section of each of the outlets 15b, 20b is the same center axis X2. The position of the first channel 15 can also be at the right side rather than at the left side as shown in FIG. 4. In addition, the position of the second channel 20 can also be at the left side rather than at the right side as shown in FIG. 4. Moreover, at one side surface of the pair of opposite side surfaces which form the combined channel 19, three outlets 15b of the first channels 15 are formed; and at the other side surface, three outlets 20b of the second channels 20 are formed. Each of the outlets 15b, 20b is arranged side by side along the longitudinal direction of the combined channel 19.

The fluids F1, F2 supplied and pumped from the inlets 15a, 20a of the first and second channels 15, 20 respectively flow from the wide-width portions 16, 21, through the tapers 18, 23 and into the narrow-width portions 17, 22. The fluids F1, F2 which flowed into the narrow-width portions 17, 22 respectively flow from the outlets 15b, 20b into the combined channel 19 in a flow rate faster than that when flowed into the inlets 15a, 20a. At this time, the positions of the two outlets 15b, 20b facing the center axis X1 are the same, and since the fluids F1, F2 face each other in a one-to-one relationship and are respectively discharged from the outlets 15b, 20b to the combined channel 19, the fluids F1, F2 collide with each other from the front. Therefore, compared to the case that each fluid F1, F2 flows and combines in a laminar state, the contact area of each fluid F1, F2 is increased and the fluids F1, F2 are efficiently mixed. In addition, by colliding the fluids F1, F2 with each other from the front, the fluid elements within each fluid F1, F2 are subjected to shear force from the flow direction of the first fluid F1 and the flow direction of the second fluid F2. Thus, the mixing speed of the fluids F1, F2 is increased. Especially, if at least one of the fluids F1, F2 is a low liquidity and high viscosity liquid, and the viscosity difference of the fluids F1, F2 is large, it can be particularly effective.

The opening section 19b of the combined channel 19 is closed. Thus, after colliding, the fluids F1, F2 flow to the opening section 19c because of the pressure of main liquid pumping mechanism. Considering the pressure loss that generates at the combined channel 19, the stable flowing-through of the high viscosity fluids and fluids having different viscosity, the mixing force and the strength of the device, the width of the combined channel 19, i.e., the distance between each outlet 15b, 20b is preferably set to be greater than or equal to 0.1 mm and smaller than or equal to 30 mm. In addition, the depth of the combined channel 19 is preferably set to be greater than or equal to 0.3 mm. The width of the combined channel 19 can be changed according to the viscosity of each fluid F1, F2 and the intended mixing degree. If the width of the combined channel 19 is reduced, the colliding force of each fluid is increased while the pressure loss is relatively increased, and the shear force within the fluids is increased. If the width of the combined channel 19 is increased, notwithstanding the colliding force of each fluid becoming weak, the pressure loss is reduced.

Figure 5:
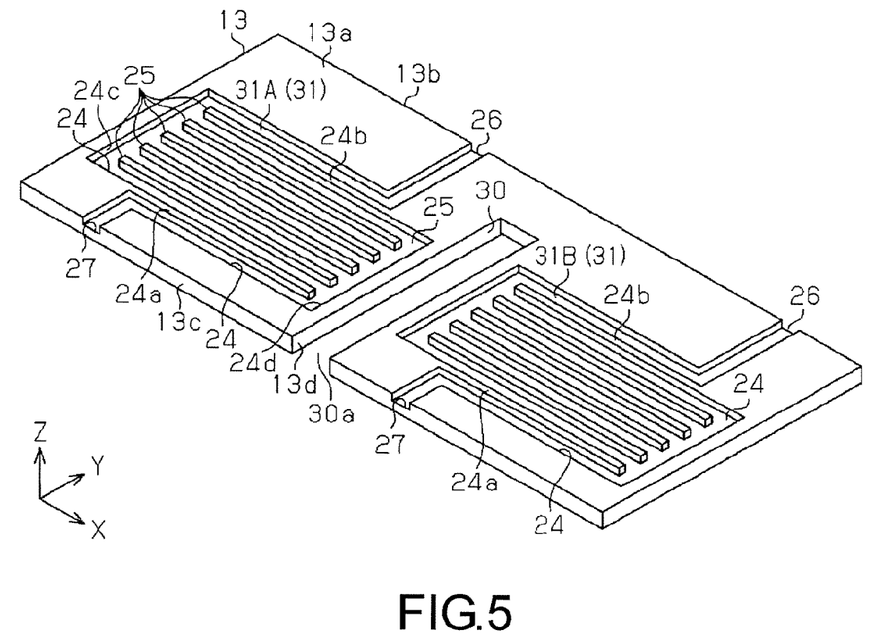
FIG. 5 is a perspective view of the temperature control plate.

Next, the temperature control plate 13 is described with reference to FIG. 5.

The temperature control plate 13 is a rectangular shape and formed in a plate shape. The temperature control plate 13 has substantially the same size as that of the mixing plate 14. At the center of the longitudinal direction of the temperature control plate 13, the heat insulating section 30 is formed. The heat insulating section 30 is disposed in a manner to be overlapped with the combined channel 19 which is formed by the laminated mixing plate 14. The heat insulating section 30 is formed in an elongated shape. The heat insulating section 30 is formed by cutting out the temperature control plate 13 from the front surface 13c to the depth direction (the Y direction in the figure). The heat insulating section 30 passes through the thickness direction (the Z direction in the figure) of the temperature control plate 13. The heat insulating section 30 has an opening section 30a at the front surface 13c of the temperature control plate 13. The width of the heat insulating section 30 is substantially the same as the width of the mixing plate 14 and the combined channel 19.

In the temperature control plate 13, recess sections 24 that are substantially rectangle-shaped are respectively formed at the left side and the right side with respect to the heat insulating section 30. At the upper surface 13a of the temperature control plate 13, flow-in channels 26 and flow-out channels 27 are formed. All of the flow-in channels 26 and the flow-out channels 27 are formed groove-shaped and respectively communicate with the recess sections 24.

At the bottom surface of the recess sections 24, elongated wall sections 24a, 24b are formed. The wall sections 24a, 24b extend in the longitudinal direction (the X direction in the figure) of the temperature control plate 13. A portion of the channel is constructed from the space configured between the tip of each wall section 24a, 24b and the inner wall surfaces of each recess section 24. At the bottom surface of the recess section 24, between the two wall sections 24a, 24b, four elongated wall sections 25 are formed. The total length of the wall section 25 is shorter than the width of the recess section 24 (the X direction in the figure). A space is configured between two ends of the wall sections 25 and the inner wall surfaces of each recess section 24, so as to configure a portion of the channel. Each wall section 24a, 24b, 25 divides the space within the recess section 24 and forms the channels for the heat mediums H1, H2 to flow therethrough. In other words, each wall section 24a, 24b, 25 consists of the heat medium channel 31 as a medium channel for the heat mediums H1, H2 to flow therethrough. The heat medium channel 31 includes the flow-in channel 26 and the flow-out channel 27. The heat medium channel 31 extends from the flow-in channel 26 to the center of the temperature control plate 13 and bends, and then extends to the left side 24c of the recess section 24. Moreover, the heat medium channel 31 bends in front of the left side 24c and extends to the right side 24d of the recess section 24. Moreover, the heat medium channel 31 bends in front of the right side 24d and extends again to the left side 24c. As such, the heat medium channel 31 bends a plurality of times within the recess section 24 and leads to the flow-out channel 27.

The heat medium channel 31A is formed at the recess section 24 of the left side of the temperature control plate 13, and the heat medium channel 31B is formed at the recess section 24 of the right side of the temperature control plate 13. The heat medium H1 is supplied at the heat medium channel 31A, and the heat medium H2 is supplied at the heat medium channel 31B. As shown in FIG. 4, by laminating the mixing plates 14 at the above or below of the temperature control plate 13, the first heat medium channel 31A, through-which the heat medium H1 flows is overlapped at the above and below of the first channel 15 through-which the first fluid F1 flows. The second heat medium channel 31B through-which the heat medium H1 flows is overlapped at the above or below of the second channel 20 through-which the second fluid F2 flows. Accordingly, the heat exchange can be performed between the first heat medium H1 and the second heat medium H2, and the heat exchange can be performed between the second heat medium H2 and the second fluid.

The heat transfer at the periphery of each heat medium channel 31A, 31B can be suppressed by the heat insulating section 30. Therefore, though heat mediums H1, H2 having large temperature difference are respectively supplied to the heat medium channels 31A, 31B, the temperatures of the heat mediums H1, H2 are not significantly reduced to be lower than the desired temperature, and do not increase. Therefore, even in the micro mixer 1 in which temperatures of the fluids F1, F2 within the channels are change easily, the temperature of the first and second fluids F1, F2 can be adjusted accurately. In other words, the temperature decreasing to be lower than the desired temperature range of the fluids F1, F2 can be suppressed. Accordingly, each channel 15, 20 and the combined channel 19 may not be blocked by the precipitates. As a result, in the micro-particles manufacturing, a decrease of productivity due to crystallization can be prevented.

Figure 6:
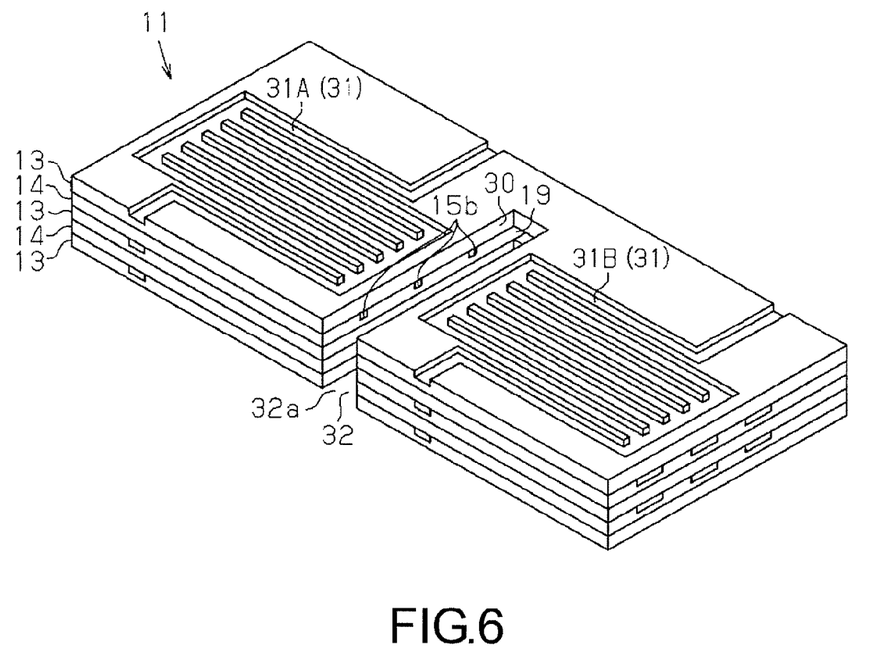
FIG. 6 is a perspective view of the laminated body.

As shown in FIG. 6, since the three temperature control plates 13 and the two mixing plates 14 are alternatively laminated, the heat insulating section 30 of the temperature control plate 13 and the combined channel 19 of the mixing plate 14 are overlapped. As a result, in the laminated body 11, the vertical combined channel 32 having a depth which is the same distance as the length of the lamination direction is configured, wherein the combined channel 19 is part of the vertical combined channel 32. At the left side of the vertical combined channel 32, six outlets 15b of the first channels 15 are disposed. Also at the right side of the vertical combined channel 32, six outlets 20b of the second channels 20 are disposed. The outlets 15b are respectively configured opposite to the outlets 20b. Each temperature control plate 13 and each mixing plate 14 are in a state of being closely attached to each other, and the upper openings of the first and second channels 15, 20 of the mixing plates 14 are closed by the bottom surface of the temperature control plates 13. In addition, the upper openings of the heat medium channels 31A, 31B of the temperature control plates 13 are closed by the bottom surface of the mixing plate 14 or the bottom surface of the cover plate P1.

In the above mentioned laminated body 11, the first fluid F1 is supplied from the first fluid supply section 4A in the case C in a pressurized state. After the first fluid F1 is temporarily stored in the storage section S1, the first fluid F1 is divided into six first channels 15 of the laminated body 11 and then supplied. On the other hand, the second fluid F2 is supplied from the second fluid supply section 4B in the case C in a pressurized state. After the second fluid F2 is temporarily stored in the storage section S2, the second fluid F2 is divided into six second channels 20 of the laminated body 11 and then supplied.

The first fluid F1 is sent out to the combined channel 19 by the outlets 15b while flowing from the wide-width portions 16 to the narrow-width portions 17 of the first channels 15 and increasing the flow rate. On the other hand, the second fluid F2 is sent out to the combined channel 19 by the outlets 20b while flowing from the wide-width portions 21 to the narrow-width portions 22 of the second channels 20 and increasing the flow rate. The micro flow of the first fluid F1 discharged from each of the outlets 15b and the micro flow of the second fluid F2 discharged from each of the outlets 20b collide from the front in a one-to-one relationship. Accordingly, since the micro flow of each of the first and second fluids F1, F2 are mixed by colliding, the overall mixing speed is further enhanced. The fluids F1, F2 respectively discharged from the six pairs of outlets 15b, 20b flow toward the outlets 32a of the vertical combined channel 32 after turbulent mixing in the combined channel 19. The mixed fluid F3 is discharged from the outlet 32a to the sending section 10 and then discharged to the external of the case C.

In the micro mixer 1, in order to increase the processing amount of the fluid F1, F2 which are objects to be mixed, without changing the width of the vertical combined channel 32, i.e., the distance between the outlets 15b, 20b, the length of vertical combined channel 32 can be extended. Alternatively, without changing the width of the vertical combined channel 32, the quantity of the channels 15, 20 which are opened at the side surface of the combined channel 19 can be increased, or the quantity of the laminated mixing plates 14 can also be increased. Accordingly, without degrading the mixing efficiency at the vertical combined channel 32, the processing speed can be increased. In addition, in the micro mixer 1, the capacity of the vertical combined channel 32 can be relatively increased, and the blocking of channel due to the increasing of pressure loss can also be prevented. Moreover, the width of the vertical combined channel 32 can be appropriately changed depending on the viscosity of the fluids which are the objects to be mixed. As a result, the degree of freedom relative to the design of the device is increased.

Herein, each case of the application of the micro mixer 1 is described.

First, one example of resin synthetic experiment is described. An isocyanate compound that has been adjusted to have a viscosity of 3 mPa·s is used as the first fluid F1, and an acrylate that has been adjusted to have a viscosity of 4 mPa·s is used as the second fluid F2. Then, by using a plunger pump, the flow rate of the first and second fluids F1, F2 is made to 100 g/min, and the first and second fluids F1, F2 are collided and mixed at the vertical combined channel 32. After that, by continuously using the micro mixer 1, the synthetic reaction is performed. As a result, the reaction rate is 94%.

On the other hand, if the conventional laminated micro mixer is used in the same experiment, the reaction rate is 90%.

In other words, if the micro mixer 1 of the above mentioned embodiment is used, since the fluids are efficiently mixed, the reaction rate is increased.

According to the above mentioned embodiment, the following effects can be achieved.

(1) The mixing plate 14 of the micro mixer 1 has the first channel-forming section 14A having the first channel 15 formed for the first fluid F1 to flow therethrough and a second channel-forming section 14B having the second channel 20 formed for the second fluid F2 to flow therethrough. Each of the outlets 15b, 20b of the first and second channels 15, 20 are opposite to each other with respect to the combined channel 19, in which the first fluid F1 and the second fluid F2 merge disposed therebetween. The position of the outlet 15b facing the center axis X1 of the combined channel 19 and the position of the outlet 20b facing the center axis X1 of the combined channel 19 are the same. In other words, the cross-section center axes of the outlets 15b, 20b of the first and second channels 15, 20 are the same center axis X2. Therefore, the flow direction of the first fluid F1 from the first channel 15 and the flow direction of the second fluid F2 from the second channel 20 are in opposite directions and symmetric with respect to the center axis X1 of the combined channel 19. Therefore, the fluids F1, F2 collide from the front. As a result, the contact area of each of the fluids F1, F2 is increased, and shear force is induced. Accordingly, high viscosity fluids and fluids having different viscosity can be efficiently mixed.

(2) The outlet surfaces of the outlets 15b, 20b of the first and second channels 15, 20 are parallel. Accordingly, the flow direction of the first fluid F1 from the first channel 15 and the flow direction of the second fluid F2 from the second channel 20 are parallel and opposite to each other. As a result, since the fluids F1, F2 collide from the front, the contact area of the fluids F1, F2 is increased and a greater shear force can be induced.

(3) The outlets 15b, 20b of the first and second channels 15, 20 are opposite to each other in a one-to-one relationship. Therefore, the fluids F1, F2 can be mixed after divided into a plurality of micro flows and further colliding the divided micro flows in a one-to-one relationship. As a result, the mixing efficiency of the fluids F1, F2 is further enhanced.

(4) At one side surface of the pair of side surfaces which form the elongated combined channel 19, three outlets 15b are arranged side by side along the longitudinal direction of the combined channel 19, and on other side surface three outlets 20b are arranged side by side along the longitudinal direction of the combined channel 19. Therefore, without changing the distance between the two outlets 15, 20b, the processing amount per mixing plate 14 can be increased by extending the combined channel 19 or by increasing the quantity of two outlets 15b, 20b. As a result, without reducing the mixing efficiency, the processing amount is improved.

(5) The micro mixer 1 has the temperature control plate 13 laminated on the mixing plate 14. The temperature control plate 13 has the first heat medium channel 31A for the first heat medium H1 to flow therethrough, the second heat medium channel 31B for the second heat medium H2 to flow therethrough, and the heat insulating section 30 disposed between the first heat medium channel 31A and the second heat medium channel 31B. In the condition that the mixing plate 14 and the temperature control plate 13 are laminated, the first channel-forming section 14A and the first heat medium channel 31A are disposed to correspond to the lamination direction, and the second channel-forming section 14B and the second heat medium channel 31B are disposed to correspond to the lamination direction. As a result, the first heat medium H1 only acts upon the first fluid F1, the second heat medium H2 only acts upon the second fluid F2. In addition, the heat insulating section 30 is disposed between the first and second heat medium channels 31A, 31B. As a result, in the micro mixer 1 in which temperatures of the fluids within the channels change easily, the temperature can be adjusted accurately since the heat transfer between the first and second heat mediums H1, H2 can be suppressed.

(6) The cross-section area of each outlet 15b, 20b of the first and second channels 15, 20 is smaller than each cross-section area of inlet 15a, 20a. Accordingly, the flow rate of each fluid F1, F2 which is discharged at the combined channel 19 can be increased. As a result, the colliding force of the fluid F1 from the first channel 15 and the fluid F2 from the second channel 20 is increased and a great shear force can be obtained.

The micro mixer 1 is used in the different viscous fluids experiment. The wide-width portions 16, 21 of the first and second channels 15, 20 having width 8 mm×depth 0.2 mm×length 30 mm and narrow-width portions 17, 22 having width 0.4 mm×depth 0.2 mm×length 1 mm are set. In addition, the combined channel 32 and the heat insulating section 30 are configured to have width 2.0 mm×depth 1.0 mm×length 15 mm. One mixing plate 14 is fixed at the cover plates P1, P2, and two temperature control plates 13 are laminated above and below, and accommodated in the case C. A plunger pump is used so that water with a viscosity of 1 mPa·s and syrup with a viscosity of 100 mPa·s flow in a flow rate of 10 g/min and merge at the combined channel 32.

As a result, the pressure loss at the vertical combined channel 32 is about 0.2 MPa, and each fluid F1, F2 is capable to flow smoothly without intermittence. Accordingly, it was proved that in the micro mixer 1 of Embodiment 1, the pressure loss can be reduced because of the large capacity of the vertical combined channel 32.

Comparative Example

A conventional Y-shaped micro mixer is used in the different viscous fluids experiment. The channel disposed in the Y-shaped micro mixer for the first fluid to flow therethrough having width 0.4 mm×depth 0.2 mm×length 15 mm and the channel for the second fluid to flow therethrough having width 0.4 mm×depth 0.2 mm×length 15 mm are set. In addition, the channel for the mixed fluid to flow therethrough is configured to have width 0.8 mm×depth 0.2 mm×length 15 mm. The plate in which channels are formed has the same material as that of Embodiment 1. Therefore, the roughness of the channel wall surface is the same as that of Embodiment 1. In addition, as in Embodiment 1, the plunger pump is used for water with a viscosity of 1 mPa·s and syrup with a viscosity of 100 mPa·s to flow. As a result, the pressure loss of the channel in which the mixed fluid flow therethrough is above 10 MPa, and the low viscous water flows intermittently and is difficult to flow stably. Each of the channels is disposed in the Y-shaped mixer in a manner that each channel intersects each other so that the fluids merge. Therefore, when two types of fluids having different viscosity flow in each channel, the flow rate of the low viscosity fluid is increased while the flow rate of the high viscosity fluid is decreased. Therefore, intermittent flow is generated.

Furthermore, the above embodiment can be modified as follows.

Figure 7:
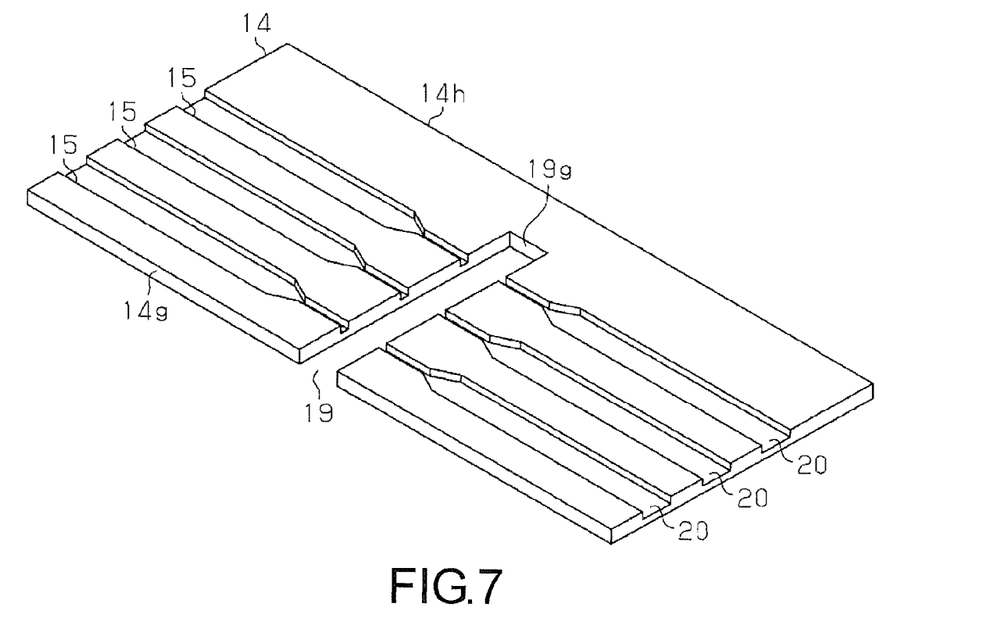
FIG. 7 is a perspective view of the mixing plate of another example.
Figure 8:
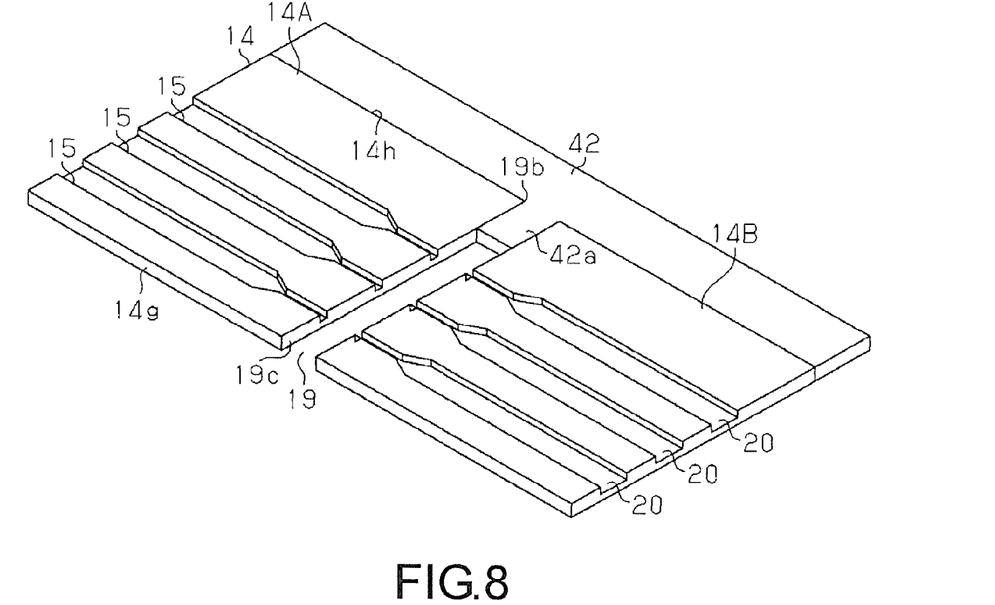
FIG. 8 is a perspective view of the mixing plate of another example.

As shown in FIG. 7, an elongated notch can be formed at the center of the front surface 14g of the mixing plate 14 so as to form the combined channel 19. As shown in FIG. 8, at the opening section 19b of the combined channel 19 of the mixing plate 14 of Embodiment 1, a T-shaped blocking member 42 can be connected.

Figure 9:
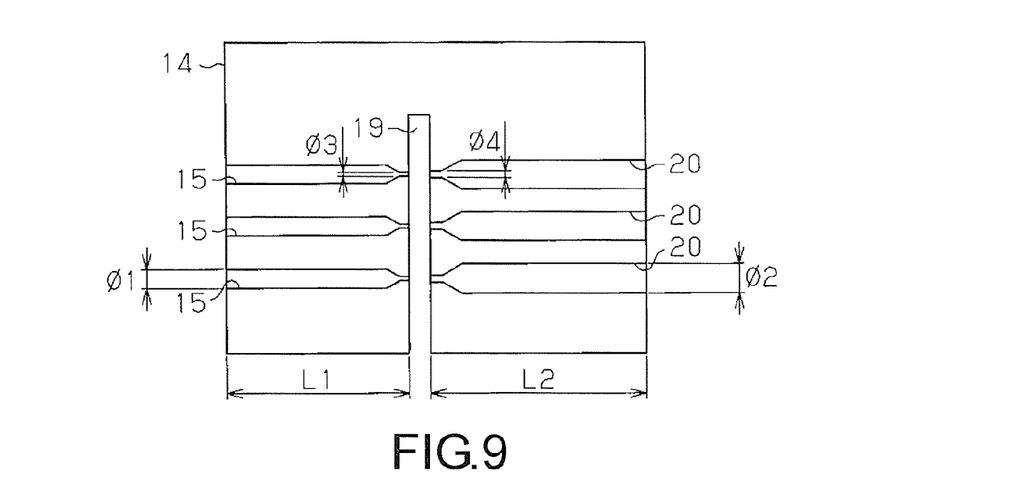
FIG. 9 is a plan view of the mixing plate of another example.

As shown in FIG. 9, the channel width Φ1 of the inlet (wide-width portion) of the first channel 15 can be different to the channel width φ2 of the inlet (wide-width portion) of the second channel 20. In addition, the channel width φ3 of the outlet (narrow-width portion) of the first channel 15 can be different to the channel width φ4 of the outlet (narrow-width portion) of the second channel 20. For instance, in the case that the second fluid F2 having a higher viscosity than the first fluid F1 flows in the second channel 20, the channel width φ2 of the second channel 20 can be larger than the channel width φ1 of the first channel 15. Herein the cross-section area of each channel is different because the channel width of each channel is different. In addition, the channel length L1 of the first channel 15 can be different to the channel length L2 of the second channel 20.

Figure 10:
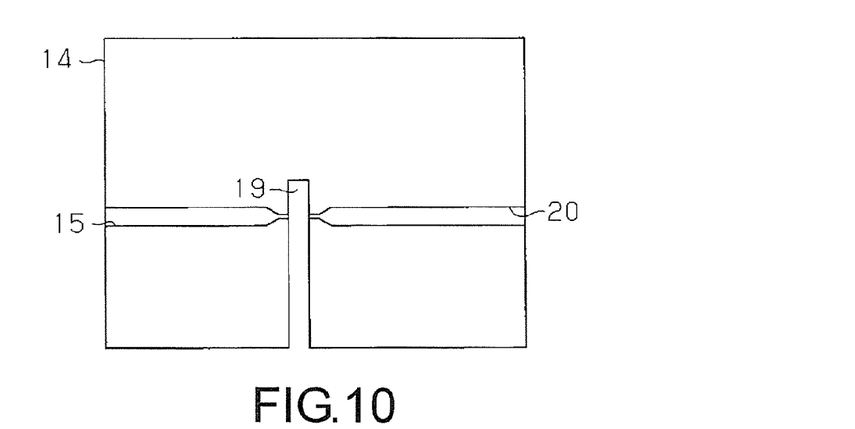
FIG. 10 is a plan view of the mixing plate of another example.

As shown in FIG. 10, the quantity of the first and second channels 15, 20 can respectively be one. Alternatively, the quantity of the first and second channels 15, 20 can respectively be two or above four.

Figure 11:
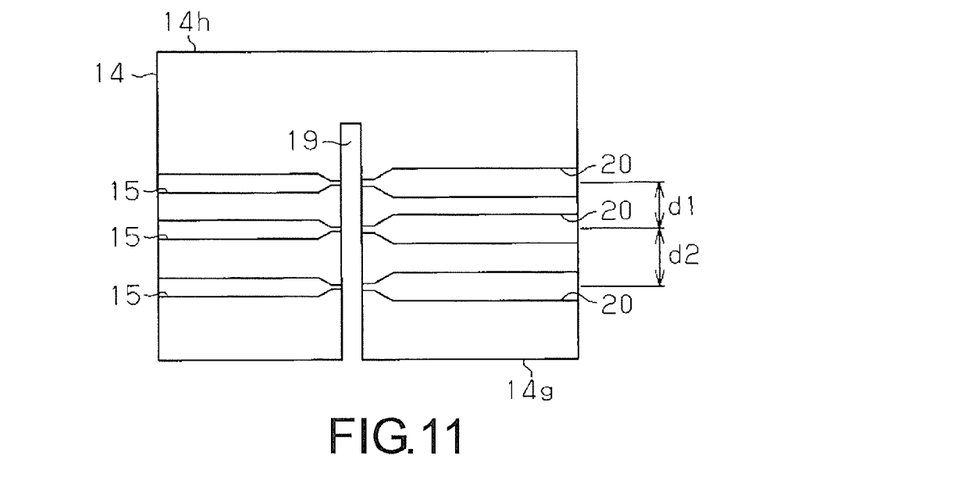
FIG. 11 is a plan view of the mixing plate of another example.

As shown in FIG. 11, the interval d2 between the first channel 15 of the center and the first channel 15 which is at the closest to the front surface 14g of the mixing plate 14 can be greater than the interval d1 between the first channel 15 which is at the closest to the back surface 14h of the mixing plate 14 and the first channel 15 of the center.

Figure 12:
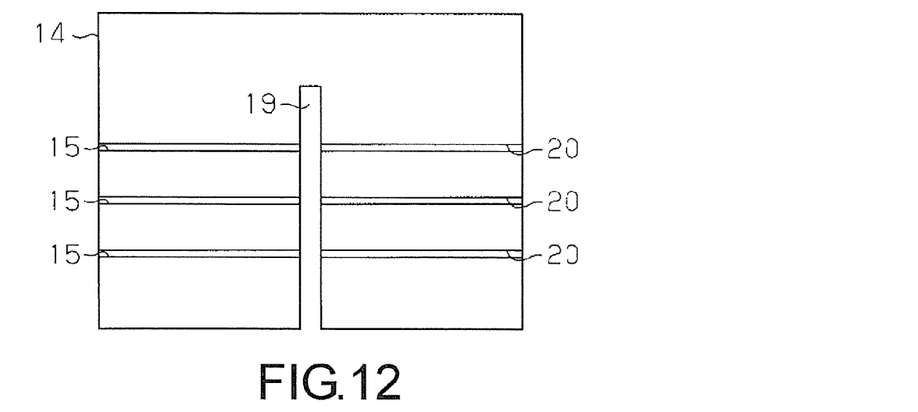
FIG. 12 is a plan view of the mixing plate of another example.

Moreover, when fluids, which generate intermittent flow easily, are processed, as shown in FIG. 12, the first and second channels 15, 20 can extend in a straight line along the longitudinal direction of the mixing plate 14. Just one of the first and channels 15, 20 may be in a straight line, and one of the channels may be in different shape with the other channel.

Figure 13:
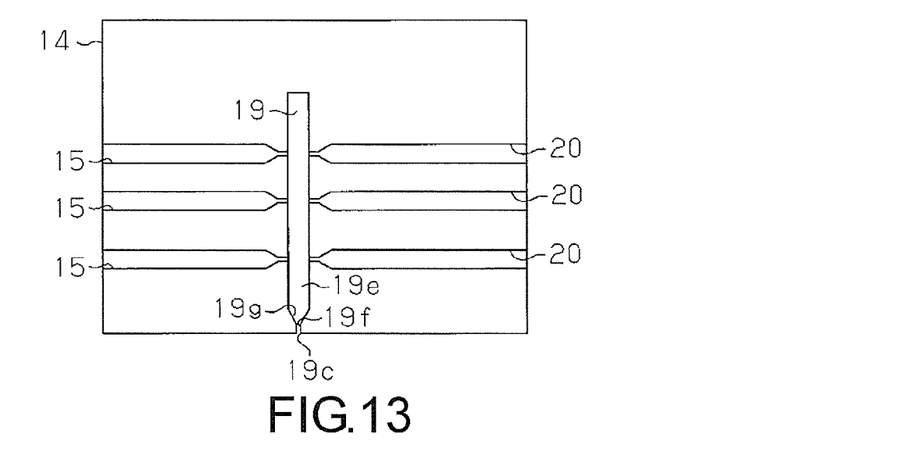
FIG. 13 is a plan view of the mixing plate of another example.
Figure 14:
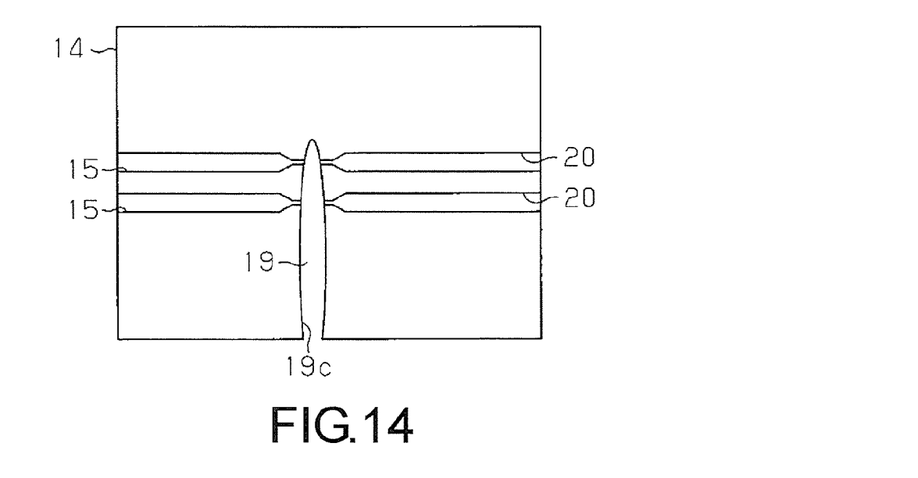
FIG. 14 is a plan view of the mixing plate of another example.

As shown in FIG. 13, the combined channel 19 may consist of a wide-width portion 19e, a narrow-width portion 19f having a smaller width than the wide-width portion 19e and a taper section 19g which is disposed between the wide-width portion 19e and the narrow-width portion 19f. As shown in FIG. 14, the channel width of the combined channel 19 can be disposed to be gradually reduced toward the opening section 19c which is the outlet of the combined channel 19.

Figure 15:
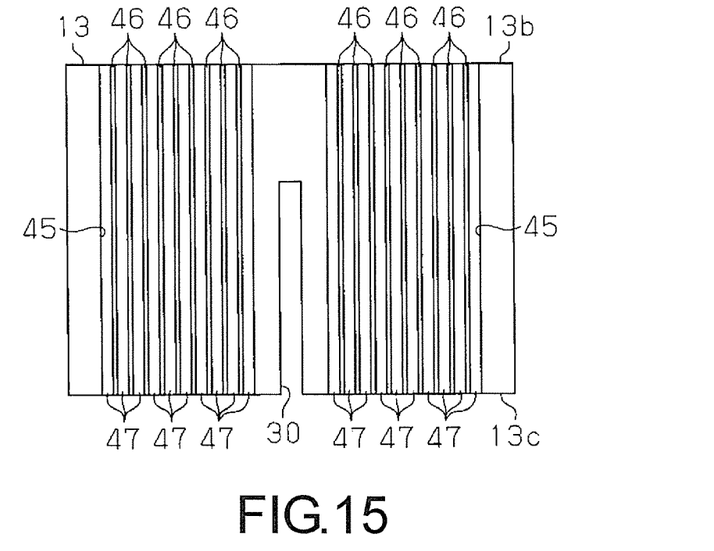
FIG. 15 is a plan view of the temperature control plate of another example.

As shown in FIG. 15, together with the recess section 45, which sandwiches the heat insulating section 30 of the temperature control plate 13 and is respectively opened at the upper surface 13a, the back surface 13b and the front surface 13c, the wall sections 46 can be formed within the recess section 45. The wall section 46 extends through from the back surface 13b to the front surface 13c along the short direction of the temperature plate 13. Also in this case, the space within the recess section 46 is divided into a plurality of elongated spaces by the wall sections 46 so as to form the heat medium channels 47. The heat medium channels 47 are formed orthogonal to the first and second channels 15, 20. Therefore, the heating efficiency or the cooling efficiency can be improved.

A heat insulating member may be embedded in the heat insulating section 30 of the temperature control plate 13, and the heat insulating section 30 can also be integrally formed.

Figure 16:
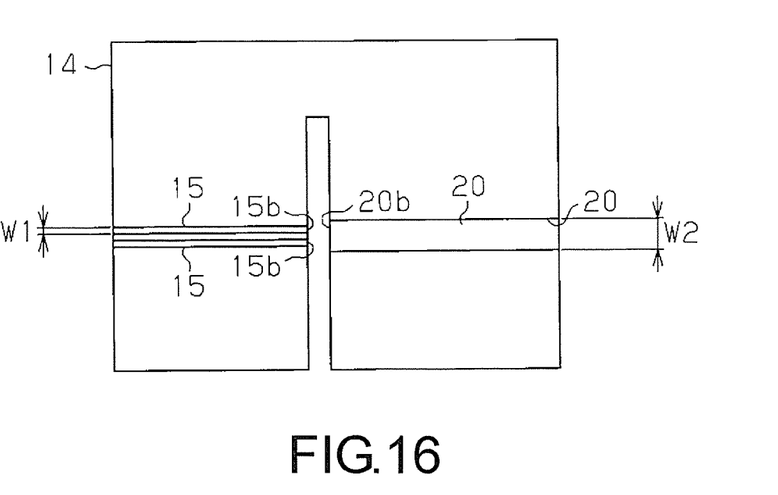
FIG. 16 is a plan view of the temperature control plate of another example.

The position of the outlet 15b of the first channel 15 facing the center axis X1 of the combined channel 19 can be included in the position of the outlet 20b of the second channel 20 facing the center axis X1. As shown in FIG. 16, the width W2 of the outlet 20b of the second channel 20 can be more than twice of the width W1 of the outlet 15b of the first channel 15. In other words, the first fluid F1 discharged from two first channels 15 and the second fluid F2 discharged from one second channel 20 can collide.

The first and second channels 15, 20 of the mixing plate 14 can be alternated to consist of one channel extended from each of the inlets 15a, 20a and a plurality of outlets 15b, 20b divided from the one channel.

In the case that the temperature adjustment is not required, only the mixing plate 14 can be laminated.

The micro mixer 1 can consist of only one mixing plate 14.

What is claimed is:

1. A micro mixer, configured to mix more than two types of fluids, wherein the micro mixer comprises:
   a mixing plate having a first channel-forming section and a second channel-forming section, a first channel for a first fluid to flow therethrough is formed at the first channel-forming section, a second channel for a second fluid to flow therethrough is formed at the second channel-forming section; and
   a combined channel disposed between the first channel-forming section and the second channel-forming section and at which the first fluid and the second fluid are merged, wherein a plurality of first outlets of the first channel and a plurality of second outlets of the second channel are opposed to each other with the combined channel disposed therebetween, and a position of the plurality of first outlets of the first channel facing a center axis of the combined channel is included in or the same as a position of the plurality of second outlets of the second channel facing the center axis,
   wherein the mixing plate consists of a pair of adjustable plates, a width of the combined channel is adjusted by adjusting a distance between the pair of adjustable plates, and
   wherein the first channel has the plurality of first outlets and a plurality of first inlets, the second channel has the plurality of second outlets and a plurality of second inlets, the first outlets of the first channel and the first inlets of the first channel are in a one-to-one relationship and the second outlets of the second channel and the second inlets of the second channel are in a one-to-one relationship, and in the first channel and the second channel, a cross-section area of each of the first and second outlets is smaller than a cross-section area of each of the first and second inlets.

2. The micro mixer according to claim 1, further comprising a temperature control plate laminated to the mixing plate, wherein the temperature control plate comprises a first medium channel for a first medium to flow therethrough, a second medium channel for a second medium to flow therethrough, and a heat insulating section disposed between the first medium channel and the second medium channel,
   in a condition that the mixing plate and the temperature control plate are laminated, the first channel-forming section and the first medium channel are disposed to correspond to a lamination direction, and the second channel-forming section and the second medium channel are disposed to correspond to the lamination direction.

3. The micro mixer according to claim 2, wherein the heat insulating section consists of a space of a predetermined width and has a depth of a same distance as a thickness of the temperature control plate,
   through a configuration of the heat insulating section of the temperature control plate being overlapped to the combined channel of the mixing plate, a vertical combined channel which has a depth of a same distance as a length of a lamination direction is configured to a laminated body consisting of the temperature control plate and the mixing plate, wherein the combined channel is part of the vertical combined channel.

4. The micro mixer according to claim 1, wherein a first outlet surface of the first channel is parallel to a second outlet surface of the second channel.

5. The micro mixer according to claim 1, wherein a center axis of a cross-section of the plurality of first outlets of the first channel and a center axis of a cross-section of the plurality of second outlets of the second channel are the same.

6. The micro mixer according to claim 5, wherein a first outlet surface of the first channel is parallel to a second outlet surface of the second channel.

7. The micro mixer according to claim 1, wherein the plurality of first outlets of the first channel and the plurality of second outlets of the second channel are configured oppose to each other and in a one-to-one relationship.

8. The micro mixer according to claim 7, wherein the combined channel is formed in an elongated shape, at a side surface of a pair of opposite side surfaces which form the combined channel, the plurality of first outlets of the first channel are arranged side by side along a longitudinal direction of the combined channel, and at another side surface of the pair of opposite side surfaces, the plurality of second outlets of the second channel are arranged side by side along the longitudinal direction of the combined channel.

* * * * *